(12) United States Patent
Abrams et al.

(10) Patent No.: US 7,921,385 B2
(45) Date of Patent: Apr. 5, 2011

(54) MASK-PATTERN DETERMINATION USING TOPOLOGY TYPES

(75) Inventors: Daniel S. Abrams, Mountain View, CA (US); Christopher James Ashton, Campbell, CA (US)

(73) Assignee: Luminescent Technologies Inc., Palo Alto, CA (US)

(*) Notice: Subject to any disclaimer, the term of this patent is extended or adjusted under 35 U.S.C. 154(b) by 753 days.

(21) Appl. No.: 11/538,420

(22) Filed: Oct. 3, 2006

(65) Prior Publication Data

US 2007/0186208 A1 Aug. 9, 2007

Related U.S. Application Data

(60) Provisional application No. 60/723,319, filed on Oct. 3, 2005.

(51) Int. Cl.
*G06F 17/50* (2006.01)
(52) U.S. Cl. .......... 716/50; 716/51; 716/52; 716/53; 716/54; 716/55
(58) Field of Classification Search .......... 716/19–21, 716/50–55; 430/5, 22, 30
See application file for complete search history.

(56) References Cited

U.S. PATENT DOCUMENTS

| | | | |
|---|---|---|---|
| 4,752,957 A | 6/1988 | Maeda | |
| 5,242,770 A | 9/1993 | Chen et al. | |
| 5,301,101 A | 4/1994 | MacArthur et al. | |
| 5,418,092 A | 5/1995 | Okamoto | |
| 5,489,509 A | 2/1996 | Kawabata et al. | |
| 5,508,803 A | 4/1996 | Hibbs et al. | |
| 5,525,808 A | 6/1996 | Irie et al. | |
| 5,546,189 A | 8/1996 | Svetkoff et al. | |
| 5,546,225 A | 8/1996 | Shiraishi | |
| 5,640,199 A | 6/1997 | Garakani et al. | |
| 5,707,765 A | 1/1998 | Chen | |
| 5,889,678 A | 3/1999 | Inoue et al. | |
| 6,022,644 A | 2/2000 | Lin et al. | |
| 6,042,998 A | 3/2000 | Brueck et al. | |
| 6,096,567 A | 8/2000 | Kaplan et al. | |

(Continued)

FOREIGN PATENT DOCUMENTS

WO WO 2006/078791 A2 7/2006

(Continued)

OTHER PUBLICATIONS

S. Osher and R. P. Fedkiw, "Level set methods: an overview and some recent results", J. Computational Physics, vol. 169, No. 2, pp. 463 May 20, 2001.

(Continued)

*Primary Examiner* — Paul Dinh
(74) *Attorney, Agent, or Firm* — Wilson Sonsini Goodrich & Rosati

(57) ABSTRACT

A method for determining a mask pattern is described. During the method, a first mask pattern that includes a plurality of second regions corresponding to the first regions of the photomask is provided. Then, a second mask pattern is determined based on the first mask pattern and differences between a target pattern and an estimate of a wafer pattern that results from the photolithographic process that uses at least a portion of the first mask pattern. Note that the determining includes different treatment for different types of regions in the target pattern, and the second mask pattern and the target pattern include pixilated images.

25 Claims, 5 Drawing Sheets

U.S. PATENT DOCUMENTS

| | | | |
|---|---|---|---|
| 6,123,733 A | 9/2000 | Dalton | |
| 6,383,847 B1 | 5/2002 | Ditlow et al. | |
| 6,468,711 B1 | 10/2002 | Sorori et al. | |
| 6,484,306 B1 | 11/2002 | Bokor et al. | |
| 6,563,566 B2 | 5/2003 | Rosenbluth et al. | |
| 6,596,466 B1 | 7/2003 | Pohland et al. | |
| 6,601,192 B1 | 7/2003 | Bowman-Amuah | |
| 6,611,627 B1 | 8/2003 | LaRossa et al. | |
| 6,617,096 B2 | 9/2003 | Burkhard | |
| 6,677,948 B1 | 1/2004 | Wasserman et al. | |
| 6,698,007 B2 | 2/2004 | Wu et al. | |
| 6,703,170 B1 | 3/2004 | Pindo | |
| 6,704,920 B2 | 3/2004 | Brill et al. | |
| 6,733,929 B2 | 5/2004 | Pierrat | |
| 6,756,980 B2 | 6/2004 | Hayashi | |
| 6,764,795 B2 | 7/2004 | Aton et al. | |
| 6,787,271 B2 | 9/2004 | Cote | |
| 6,795,069 B2 | 9/2004 | Raskar et al. | |
| 6,798,412 B2 | 9/2004 | Cowperthwaite | |
| 6,799,313 B2 | 9/2004 | LaCour | |
| 6,809,797 B2 | 10/2004 | Baselmans et al. | |
| 6,880,135 B2 | 4/2005 | Chang et al. | |
| 6,968,532 B2 | 11/2005 | Sivakumar et al. | |
| 7,027,658 B2 | 4/2006 | Osher et al. | |
| 7,031,538 B2 | 4/2006 | Osher et al. | |
| 7,073,162 B2 | 7/2006 | Cobb et al. | |
| 7,124,394 B1 | 10/2006 | Abrams et al. | |
| 7,175,945 B2 | 2/2007 | Mieher et al. | |
| 7,178,127 B2 | 2/2007 | Abrams et al. | |
| 7,231,628 B2 | 6/2007 | Pack et al. | |
| 7,236,123 B2 | 6/2007 | Siegel | |
| 7,302,090 B2 | 11/2007 | Kalus et al. | |
| 7,353,145 B2 | 4/2008 | Tanaka et al. | |
| 7,403,641 B2 | 7/2008 | Nakamoto et al. | |
| 7,441,227 B2 | 10/2008 | Abrams et al. | |
| 7,480,889 B2 | 1/2009 | Abrams et al. | |
| 7,512,927 B2 | 3/2009 | Gallatin et al. | |
| 7,571,423 B2 | 8/2009 | Abrams et al. | |
| 2001/0010884 A1* | 8/2001 | Guehler et al. | 430/7 |
| 2002/0028393 A1 | 3/2002 | Laidig et al. | |
| 2002/0066069 A1 | 5/2002 | Ashida et al. | |
| 2002/0177050 A1 | 11/2002 | Tanaka | |
| 2002/0188924 A1 | 12/2002 | Pierrat et al. | |
| 2003/0095267 A1 | 5/2003 | Mieher et al. | |
| 2003/0103189 A1 | 6/2003 | Neureuther et al. | |
| 2003/0106642 A1 | 6/2003 | Fairbairn | |
| 2003/0123707 A1 | 7/2003 | Park | |
| 2003/0140330 A1 | 7/2003 | Tanaka et al. | |
| 2003/0152841 A1 | 8/2003 | Averbukh | |
| 2003/0165749 A1 | 9/2003 | Fritze et al. | |
| 2003/0198872 A1 | 10/2003 | Yamazoe et al. | |
| 2004/0008880 A1 | 1/2004 | Horie et al. | |
| 2004/0021660 A1* | 2/2004 | Ng-Thow-Hing et al. | 345/419 |
| 2004/0031013 A1 | 2/2004 | Dulman et al. | |
| 2004/0073884 A1 | 4/2004 | Kroyan | |
| 2004/0086792 A1 | 5/2004 | Romeo et al. | |
| 2004/0101766 A1 | 5/2004 | Mesuda et al. | |
| 2004/0136587 A1 | 7/2004 | Kalus et al. | |
| 2004/0147121 A1 | 7/2004 | Nakagaki et al. | |
| 2004/0161678 A1 | 8/2004 | Misaka | |
| 2004/0166422 A1 | 8/2004 | Yamazoe et al. | |
| 2004/0169183 A1* | 9/2004 | Fujimoto et al. | 257/83 |
| 2004/0214096 A1 | 10/2004 | Dulman et al. | |
| 2004/0229133 A1 | 11/2004 | Socha et al. | |
| 2004/0265707 A1 | 12/2004 | Socha | |
| 2005/0066300 A1 | 3/2005 | Zach | |
| 2005/0122500 A1 | 6/2005 | Ye et al. | |
| 2005/0136340 A1 | 6/2005 | Baselmans et al. | |
| 2005/0142470 A1 | 6/2005 | Socha et al. | |
| 2005/0147893 A1 | 7/2005 | Ogawa et al. | |
| 2005/0191566 A1 | 9/2005 | Liu et al. | |
| 2005/0212993 A1* | 9/2005 | Lazarev et al. | 349/62 |
| 2005/0251771 A1 | 11/2005 | Robles | |
| 2005/0265605 A1 | 12/2005 | Nakamoto et al. | |
| 2006/0049978 A1 | 3/2006 | Siegel | |
| 2006/0051682 A1* | 3/2006 | Hess et al. | 430/5 |
| 2006/0172204 A1 | 8/2006 | Peng et al. | |
| 2006/0273242 A1 | 12/2006 | Hunsche et al. | |
| 2007/0009808 A1 | 1/2007 | Abrams et al. | |
| 2007/0011644 A1* | 1/2007 | Abrams et al. | 716/19 |
| 2007/0011645 A1 | 1/2007 | Abrams et al. | |
| 2007/0011647 A1 | 1/2007 | Abrams et al. | |
| 2007/0011648 A1 | 1/2007 | Abrams et al. | |
| 2007/0023841 A1* | 2/2007 | Kim | 257/368 |
| 2007/0026613 A1* | 2/2007 | Ryu et al. | 438/266 |
| 2007/0133862 A1* | 6/2007 | Gold et al. | 382/149 |
| 2007/0136716 A1 | 6/2007 | Abrams et al. | |
| 2007/0156327 A1* | 7/2007 | Tipping et al. | 701/200 |
| 2007/0184357 A1 | 8/2007 | Abrams et al. | |
| 2007/0184369 A1 | 8/2007 | Abrams et al. | |
| 2007/0186206 A1 | 8/2007 | Abrams et al. | |
| 2007/0192756 A1 | 8/2007 | Abrams et al. | |
| 2007/0196742 A1 | 8/2007 | Abrams et al. | |
| 2007/0198963 A1* | 8/2007 | Granik et al. | 716/19 |
| 2007/0198966 A1 | 8/2007 | Abrams et al. | |
| 2007/0217566 A1* | 9/2007 | Chen et al. | 378/4 |
| 2009/0013304 A1 | 1/2009 | Peng | |
| 2009/0073413 A1 | 3/2009 | Abrams et al. | |
| 2009/0077526 A1 | 3/2009 | Abrams et al. | |
| 2009/0077527 A1 | 3/2009 | Gergov et al. | |

FOREIGN PATENT DOCUMENTS

| | | |
|---|---|---|
| WO | WO 2006/078791 A3 | 7/2006 |
| WO | WO 2007/033362 A2 | 3/2007 |
| WO | WO 2007/033362 A3 | 3/2007 |
| WO | WO 2007/041600 A2 | 4/2007 |
| WO | WO 2007/041600 A3 | 4/2007 |
| WO | WO 2007/041602 A2 | 4/2007 |
| WO | WO 2007/041602 A3 | 4/2007 |
| WO | WO 2007/041701 A2 | 4/2007 |
| WO | WO 2007/041701 A3 | 4/2007 |
| WO | WO 2007/044557 A2 | 4/2007 |
| WO | WO 2007/044557 A3 | 4/2007 |
| WO | WO 2007/044630 A2 | 4/2007 |
| WO | WO 2007/044630 A3 | 4/2007 |
| WO | WO 2007/044827 A2 | 4/2007 |
| WO | WO 2007/044827 A3 | 4/2007 |
| WO | WO 2008/039674 A2 | 4/2008 |
| WO | WO 2008/039674 A3 | 4/2008 |
| WO | WO 2009/036364 A1 | 3/2009 |

OTHER PUBLICATIONS

Nicolas Bailey Cobb, PhD Thesis, "Fast Optical and Process Proximity Correction Algorithms for Integrated Circuit Manufacturing", U.C. Berkeley, Spring 1998.

B.E.A. Saleh and S.I. Sayegh, "Reductions of errors of microphotographic reproductions by optical corrections of original masks", Optical Eng. vol. 20, No. 5 pp. 781-784 (1981).

K.M. Nashold and B.E.A. Saleh, "Image construction through diffraction-limited high-contrast imaging systems: an iterative approach", J. Opt. Soc. Am.A, vol. 2, No. 5 pp. 635-643 (1985).

Y. Liu and A. Zakhor, "Optimal binary image design for optical lithography", Proc. SPIE vol. 1264 pp. 401-412 (1990).

Y. Liu and A. Zakhor, "Binary and phase-shifting image design for optical lithography", Proc. SPIE vol. 1463 pp. 382-399 (1991).

A. Rosenbluth et. al, "Optimum mask and source patterns to print a given shape", JM$^3$ vol. 1 No, 1 pp. 13-30 (2002).

Y-T Wang, Y.C. Pati, H. Watanabe and T. Kailath, "Automated design of halftoned double-exposure phase-shifting masks", Proc. SPIE vol. 2440 pp. 290-301 (1995).

Y.H. Oh, and J-C Lee, "Resolution enhancement through optical proximity correction and stepper parameter optimization for 0.12-um mask pattern", Proc. SPIE vol. 3679 pp. 607-613 (1999).

J.A. Sethian and D. Adalsteinsson, "An overview of level set methods for etching, deposition, and lithography development", IEEE Trans. on Semiconductor Manufacturing, vol. 10, No. 1, pp. 167-184, Feb. 1997.

J.M. Berg and N. Zhou, "Shape-based optimization of a plasma etching process", 39$^{th}$ IEEE Conf. on Decision and Control, pp. 2023-2028 (Dec. 2000).

J.M. Geremia and H. Rabitz, "Optimal Hamiltonian identification: the synthesis of quantum optimal control and quantum inversion", J. Chem. Physics, vol. 118, No. 12 pp. 5369-5382 (Mar. 2003).

Sethian, J.A., "Level set methods and fast marching methods," 1999, Cambridge University Press, pp. 1-33.

Erdmann et al., Enhancements in Rigorous Simulation of Light Diffraction from Phase Shaft Masks, Mar. 2002, SPIE, vol. 4691, pp. 1156-1167.

Gordon et al., Lithography simulation employing rigorous solution of Maxwell's equations, Feb. 1998, SPIE, vol. 3334, pp. 176196.

Wong et al., Massively Parallel Electromagnetic Simulation for Photolithographic Applications, Oct. 1995, IEEE, vol. 14, pp. 1231-1240.

Sethian, J.A., "Level set methods and fast marching methods," 1999, Cambridge University Press, pp. 316-360 (printed from website http://math.berkeley.edu/~sethian/level$_{13}$set.html).

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Amendment and Response, filed Aug. 12, 2005, in Abrams, Daniel S., et al., U.S. Appl. No. 10/408,928, "Method for Time-Evolving Rectilinear Contours Representing Photo Masks," filed Apr. 6, 2003, issued as U.S. Patent No. 7,124,394 on Oct. 17, 2006.

Office Action issued by U.S. Patent and Trademark Office, dated Feb. 14, 2005, in Abrams, Daniel et al., U.S. Appl. No. 10/408,928, "Method for Time-Evolving Rectilinear Contours Representing Photo Masks," filed Apr. 6, 2003, issued as U.S. Patent No. 7,124,394 on Oct. 17, 2006.

Office Action issued by U.S. Patent and Trademark Office, mailed Mar. 8, 2005, in Abrams, Daniel S., et al., U.S. Appl. No. 10/408,924, "Optimized Photomasks for Photolithography," filed Apr. 6, 2003, now issued as U.S. Patent 7,480,889.

Reply to Office Action, mailed Sep. 8, 2005, in Abrams, Daniel S., et al., U.S. Appl. No. 10/408,924, "Optimized Photomasks for Photolithography," filed Apr. 6, 2003, now issued as U.S. Patent 7,480,889.

Office Action issued by U.S. Patent and Trademark Office, mailed Nov. 18, 2005, in Abrams, Daniel S., et al., U.S. Appl. No. 10/408,924, "Optimized Photomasks for Photolithography," filed Apr. 6, 2003, now issued as U.S. Patent 7,480,889.

Reply to Office Action, mailed May 18, 2006, in Abrams, Daniel S., et al., U.S. Appl. No. 10/408,924, "Optimized Photomasks for Photolithography," filed Apr. 6, 2003, now issued as U.S. Patent 7,480,889.

Office Action issued by U.S. Patent and Trademark Office, mailed Jul. 14, 2006, in Abrams, Daniel S., et al., U.S. Appl. No. 10/408,924, "Optimized Photomasks for Photolithography," filed Apr. 6, 2003, now issued as U.S. Patent 7,480,889.

Reply to Office Action, mailed Jan. 16, 2007, in Abrams, Daniel S., et al., U.S. Appl. No. 10/408,924, "Optimized Photomasks for Photolithography," filed Apr. 6, 2003, now issued as U.S. Patent 7,480,889.

Office Action issued by U.S. Patent and Trademark Office, mailed Jun. 20, 2007, in Abrams, Daniel S., et al., U.S. Appl. No. 10/408,924, "Optimized Photomasks for Photolithography," filed Apr. 6, 2003, now issued as U.S. Patent 7,480,889.

Office Action issued for U.S. Patent and Trademark Office, mailed Sep. 25, 2007, in Abrams, Daniel S., et al., U.S. Appl. No. 11/549,846, "Method for Time-Evolving Rectilinear Contours Representing Photo Masks," filed Oct. 16, 2006, now issued as U.S. Patent 7,441,227.

Abrams, Daniel et al., "Method for Time-Evolving Rectilinear Contours Representing Photo Masks," Notice of Allowance issued by U.S. Patent and Trademark Office, dated Jun. 6, 2008, in U.S. Appl. No. 11/549,846, filed Oct. 16, 2006, now issued as U.S. Patent 7,441,227.

Abrams, Daniel et al., "Technique for Determining a Mask Pattern Corresponding to a Photomask," Nonfinal Office Action mailed May 28, 2009, in U.S. Appl. No. 11/674,130, filed Feb. 12, 2007.

Abrams, Daniel et al., "Method for Time-Evolving Rectilinear Contours Representing Photo Masks," Response to Restriction Requirement filed Jun. 15, 2009, in U.S. Appl. No. 11/674,133, filed Feb. 12, 2007.

Abrams, Daniel et al., "Optimized Photomasks for Photolithography," Nonfinal Office Action mailed Apr. 21, 2008, in U.S. Appl. No. 11/225,378, filed Sep. 12, 2005, issued as U.S. Patent 7,571,423.

Abrams, Daniel et al., "Lithography Verification Using Guard Bands," Nonfinal Office Action mailed Oct. 27, 2008, in U.S. Appl. No. 11/538,290, filed Oct. 3, 2006.

Abrams, Daniel et al., "Lithography Verification Using Guard Bands," Final Office Action mailed Jul. 7, 2009, in U.S. Appl. No. 11/538,290, filed Oct. 3, 2006.

Abrams, Daniel et al., "Lithography Verification Using Guard Bands," Response to Office Action filed Apr. 14, 2009, in U.S. Appl. No. 11/538,290, filed Oct. 3, 2006.

Abrams, Daniel et al., "Lithography Verification Using Guard Bands," Response to Office Action Nov. 9, 2009, in U.S. Appl. No. 11/538,290, filed Oct. 3, 2006.

Peng, Danping et al., "Systems, Masks and Methods for Printing Contact Holes and Other Patterns," Nonfinal Office Action mailed Aug. 13, 2008, in U.S. Appl. No. 11/335,018, filed Jan. 18, 2006.

Abrams, Daniel et al., "Mask-Patterns Including Intentional Breaks," Nonfinal Office Action mailed Sep. 19, 2008, in U.S. Appl. No. 11/538,782, filed Oct. 4, 2006.

Abrams, Daniel et al., "Mask-Patterns Including Intentional Breaks," Nonfinal Office Action mailed Jul. 7, 2009, in U.S. Appl. No. 11/538,782, filed Oct. 4, 2006.

Abrams, Daniel et al., "Mask-Patterns Including Intentional Breaks," Response to Office Action filed Jan. 28, 2009, in U.S. Appl. No. 11/538,782, filed Oct. 4, 2006.

Abrams, Daniel et al., "Mask-Patterns Including Intentional Breaks," Response to Office Action filed Nov. 9, 2009, in U.S. Appl. No. 11/538,782, filed Oct. 4, 2006.

Abrams, Daniel et al., "Systems, Masks, and Methods for Manufacturable Masks," Nonfinal Office Action mailed Apr. 2, 2009, in U.S. Appl. No. 11/245,691, filed Oct. 6, 2005.

Abrams, Daniel et al., "Systems, Masks, and Methods for Manufacturable Masks," Response to Office Action filed Jul. 29, 2009, in U.S. Appl. No. 11/245,691, filed Oct. 6, 2005.

Abrams, Daniel et al., "Systems, Masks, and Methods for Photomasks Optimized with Approximate and Accurate Merit Functions," Nonfinal Office Action mailed May 11, 2009, in U.S. Appl. No. 11/539,601, filed Oct. 6, 2005.

Abrams, Daniel et al., "Systems, Masks, and Methods for Photomasks Optimized with Approximate and Accurate Merit Functions," Response to Office Action filed Nov. 9, 2009, in U.S. Appl. No. 11/539,601, filed Oct. 6, 2005.

Abrams, Daniel et al., "Fast Systems and Methods for Calculating Electromagnetic Fields Near Photomasks," Nonfinal Office Action mailed Feb. 13, 2007, in U.S. Appl. No. 11/245,714, filed Oct. 6, 2005, now abandoned.

Peng, Danping et al., "Physical-Resist Model Using Fast Sweeping," Nonfinal Office Action mailed Oct. 13, 2009, in U.S. Appl. No. 11/773,923, filed Jul. 5, 2007.

Abrams, Daniel S., et al., "Optimized Photomasks for Photolithography," Final Office Action mailed Mar. 20, 2008, in U.S. Appl. No., 10/408,924, filed Apr. 6, 2003, now issued as U.S. Patent 7,480,889.

Abrams, Daniel S., et al., "Systems, Masks, and Methods for Photolithography," Nonfinal Office Action mailed Mar. 19, 2009, in U.S. Appl. No. 11/531,673, filed Sep. 13, 2005.

Abrams, Daniel et al., "Technique for Determining a Mask Pattern Corresponding to a Photomask," Response to Nonfinal Office Action filed Aug. 27, 2009, in U.S. Appl. No. 11/674,130, filed Feb. 12, 2007.

Abrams, Daniel S., et al., "Systems, Masks, and Methods for Photolithography," Response to Nonfinal Office Action filed Aug. 13, 2009, in U.S. Appl. No. 11/531,673, filed Sep. 13, 2005.

Abrams, Daniel S., et al., "Systems, Masks, and Methods for Photolithography," Notice of Allowance mailed Oct. 2, 2009, in U.S. Appl. No. 11/531,673, filed Sep. 13, 2005.

Abrams, Daniel et al., "Method for Time-Evolving Rectilinear Contours Representing Photo Masks," Notice of Allowance mailed Sep. 22, 2009, 2009, in U.S. Appl. No. 11/674,133, filed Feb. 12, 2007.

Abrams, Daniel et al., "Method for Time-Evolving Rectilinear Contours Representing Photo Masks," Restriction Requirement mailed Jan. 14, 2009, in U.S. Appl. No. 11/674,133, filed Feb. 12, 2007.

Abrams, Daniel et al., "Technique for Determining a Mask Pattern Corresponding to a Photomask," Notice of Allowance mailed Dec. 14, 2009, in U.S. Appl. No. 11/674,130, filed Feb. 12, 2007.

Abrams, Daniel et al., "Method for Time-Evolving Rectilinear Contours Representing Photo Masks," Office Action mailed Nov. 23, 2009, in U.S. Appl. No. 11/674,133, filed Feb. 12, 2007.

Abrams, Daniel S., et al., "Systems, Masks, and Methods for Photolithography," Notice of Allowance mailed Dec. 1, 2009, in U.S. Appl. No. 11/531,673, filed Sep. 13, 2005.

Abrams, Daniel et al., "Lithography Verification Using Guard Bands," Notice of Allowance mailed Dec. 28, 2009, in U.S. Appl. No. 11/538,290, filed Oct. 3, 2006.

Abrams, Daniel et al., "Systems, Masks, and Methods for Manufacturable Masks," Notice of Allowance mailed Nov. 30, 2009, in U.S. Appl. No. 11/245,691, filed Oct. 6, 2005.

Abrams, Daniel et al., "Method for Time-Evolving Rectilinear Contours Representing Photo Masks," Response to Nonfinal Office Action filed Jan. 7, 2010, in U.S. Appl. No. 11/674,133, filed Feb. 12, 2007.

* cited by examiner

╭─ 300

┌─────────────────────────────────────────────────────────────────┐
│ PROVIDE A FIRST MASK PATTERN THAT INCLUDES A PLURALITY OF SECOND │
│   REGIONS CORRESPONDING TO FIRST REGIONS OF A PHOTO-MASK        │
│                              310                                 │
└─────────────────────────────────────────────────────────────────┘
                                  │
                                  ▼
┌─────────────────────────────────────────────────────────────────┐
│ DETERMINE A SECOND MASK PATTERN IN ACCORDANCE WITH THE FIRST    │
│ MASK PATTERN AND DIFFERENCES BETWEEN A TARGET PATTERN AND AN    │
│       ESTIMATE OF A WAFER PATTERN THAT RESULTS FROM A           │
│ PHOTOLITHOGRAPHIC PROCESS UTILIZING AT LEAST A PORTION OF THE FIRST │
│  MASK PATTERN, WHERE DIFFERENT TYPES OF REGIONS IN THE TARGET   │
│  PATTERN ARE ACCORDED DIFFERENT TREATMENT, AND WHERE THE SECOND │
│  MASK PATTERN AND THE TARGET PATTERN INCLUDE PIXILATED IMAGES.  │
│                              312                                 │
└─────────────────────────────────────────────────────────────────┘

FIG. 3

MASK-PATTERN DETERMINATION USING TOPOLOGY TYPES

CROSS-REFERENCE

This application claims the benefit of U.S. Provisional Application No. 60/723,319, filed Oct. 3, 2005, which is incorporated herein by reference in its entirety.

BACKGROUND OF THE INVENTION

1. Field of the Invention

The present invention relates to techniques for determining mask patterns for lithographic processes that use photo-masks and write patterns for semiconductor-manufacturing processes that use write devices.

2. Related Art

Lithography processing represents an essential technology for manufacturing Integrated Circuits (IC) and Micro Electro-Mechanical Systems (MEMS). Lithographic techniques are used to define patterns, geometries, features or shapes (henceforth referred to as 'patterns') onto an integrated circuit die or semiconductor wafer or chips where the patterns are typically defined by a set of contours, lines, boundaries, edges or curves (henceforth referred to as 'contours'), which generally surround, enclose, and/or define the boundary of the various regions which constitute a pattern.

Demand for increased density of features on dies and wafers has resulted in the design of circuits with decreasing minimum dimensions. However, due to the wave nature of light, as dimensions approach sizes comparable to the wavelength of the light used in the photolithography process, the resulting wafer patterns deviate from the corresponding photo-mask patterns and are accompanied by unwanted distortions and artifacts.

Techniques such as Optical Proximity Correction (OPC) attempt to improve resolution and/or a process window in a photolithography process by appropriately pre-distorting the photo-mask pattern such that the wafer pattern is printed more accurately. In addition, other techniques known as resolution enhancement technologies (RET) also modify the design of the photo-mask in order to improve photolithography. However, even with these various approaches, as the density of features has increased, it has become increasingly difficult to determine suitable mask patterns that correspond to photo-mask patterns which print acceptable wafer patterns. In addition, similar challenges occur in mask-less semiconductor processes, such as those that use a write device to print a wafer pattern based on a write pattern.

Hence what is needed are improved systems and methods for facilitating determination of mask patterns and/or write patterns.

SUMMARY OF THE INVENTION

One embodiment of the present invention provides a method for determining a mask pattern During the method, a set of regions are determined which correspond to different locations on a target pattern. Then, a mask pattern is determined based on a model of a photolithographic process. During the determining of the mask pattern, the different regions are treated differently. Pixilated images are used to represent at least one of the following: the target pattern, the mask pattern, or one or more of the regions. The pixilated images may use grayscale to represent the boundaries of the regions with sub-pixel resolution.

In some embodiments, the mask pattern is determined based on a set of parameters, some of which are different in the different regions. In some embodiments, the different parameters includes different weighting of the different types of regions when calculating a merit function, the merit function indicating the suitability of a mask pattern for use in the photolithographic process. For example, the merit function might compare the difference between a simulated wafer pattern based on the photolithography model with the target pattern. In some embodiments, a first region including one or more corners in the target pattern may have a lower weight than a second region that includes one or more straight portions in the target pattern. In some embodiments, at least some of the weights may be defined based on user criteria and/or based on topology of one or more types of features in the target pattern. Note that the features may include edges.

In some embodiments, the different treatment includes different convergence criteria and/or different mask rules for the different regions.

In some embodiments, the estimated wafer pattern is determined using a model of the photolithographic process. This model may include a photo-resist model or an etch-model.

In some embodiments, the different regions are associated with different geometries of the target pattern, such as inner corners, outer corners, straight portions, angular portions, rectangular end portions or line ends, and transitional regions between any two respective regions in the target pattern. Note that at least some of the different regions may at least partially overlap. Also note that at least one type of region in the different types of regions may include one or more gates in an integrated circuit. Furthermore, the different types of regions may include regions defined based on at least a subset of functionality in the integrated circuit. Regions may also correspond to the locations which are far from the edges of the target pattern, either inside or outside of the polygons in the target pattern. Furthermore, the different regions may be defined based on at least a subset of functionality in the integrated circuit, or based on user-defined criteria.

In some embodiments the target pattern and the estimated pattern include bitmap images and/or grayscale images. Therefore, in some embodiments the determining is performed at sub-pixel resolution.

In some embodiments, the determining is performed over a range of process conditions in the photo-lithographic process. In addition, the determining may include an optical proximity correction. For example, in some embodiments the determining includes calculating a gradient of a function. This function may depend on the first mask pattern and the estimate of the wafer pattern. Note that the gradient may be calculated based on a formula obtained by taking a derivative of the function.

Another embodiment provides a computer system configured to execute instructions corresponding to at least some of the above-described operations.

Another embodiment provides a computer-program product for use in conjunction with the computer system.

Another embodiment provides a photo-mask for use in the photolithographic process. This photo-mask is determined using the above method for determining a mask pattern.

Another embodiment provides a semiconductor wafer. This semiconductor wafer is produced in the photo-lithographic process that includes the photo-mask determined in accordance with the above method Another embodiment provides a data file stored in a computer-readable memory that includes information corresponding to the mask pattern.

Another embodiment provides a method for determining a write pattern to be used by a write device in a semiconductor-manufacturing process. The write pattern is determined in accordance with the above method.

Another embodiment provides a semiconductor wafer. This semiconductor wafer is produced in the semiconductor-manufacturing process that includes the write device that uses the write pattern determined in the above-described method.

Another embodiment provides a data file stored in a computer-readable memory that includes information corresponding to the write pattern.

INCORPORATION BY REFERENCE

All publications and patent applications mentioned in this specification are herein incorporated by reference to the same extent as if each individual publication or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 3 is a flow chart illustrating a process for determining a mask pattern in accordance with an embodiment of the present invention.

Note that like reference numerals refer to corresponding parts throughout the drawings.

DETAILED DESCRIPTION OF THE INVENTION

Figure 1:
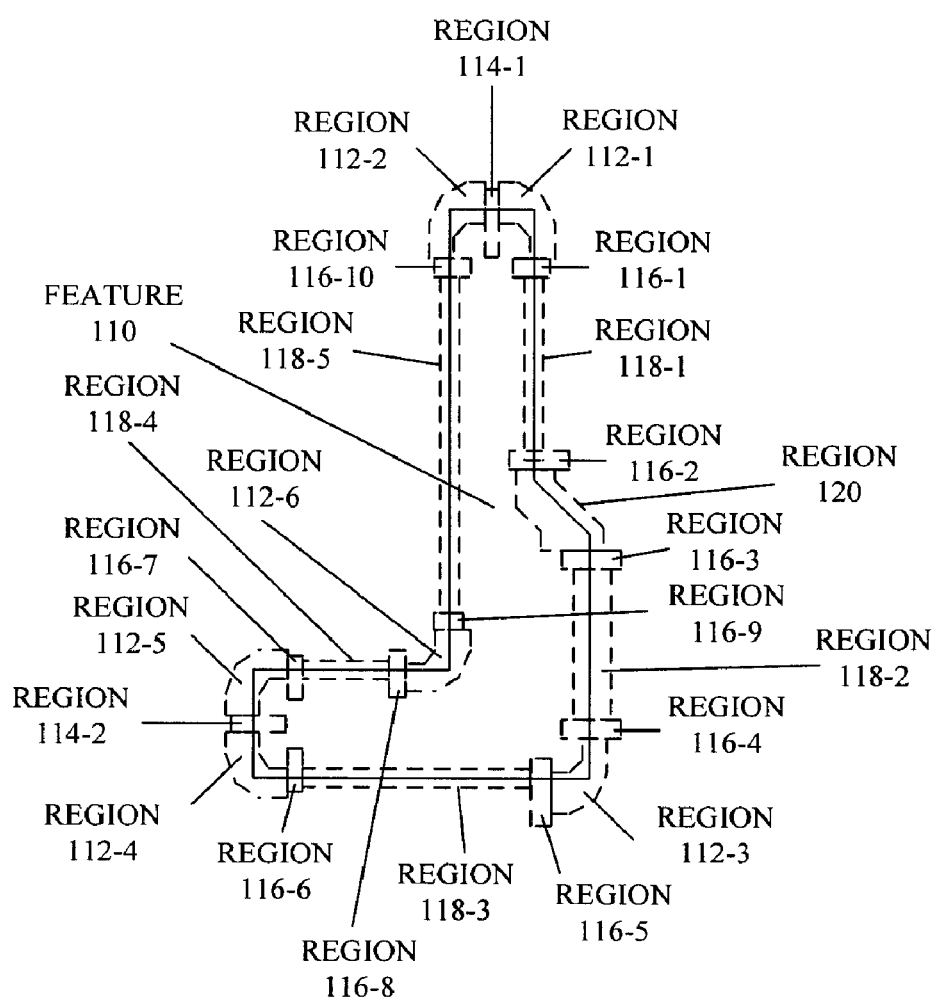
FIG. 1 is a block diagram illustrating a feature in a pattern and associated regions in accordance with an embodiment of the present invention.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software), and data structures or files for use with the computer system are described. These systems, processes, and data structures may be used to determine mask patterns that, in turn, may be used when producing photo-masks. The photo-masks may be used in (photo-) lithographic processes to produce semiconductor wafers that have associated printed wafer patterns. Alternatively, the systems, processes, and data structures may be used to determine write patterns. These write patterns may be used by write devices in mask-less semiconductor manufacturing processes to produce semiconductor wafers.

In particular, regions in a target pattern that is to be printed on a semiconductor wafer may be defined. In some embodiments, the different regions are associated with different geometries of the target pattern, such as inner corners, outer corners, straight portions, angular portions, rectangular end portions or line ends, and transitional regions between any two respective regions in the target pattern. Note that at least some of the different regions may at least partially overlap. Also note that at least one type of region in the different types of regions may include one or more gates in an integrated circuit. Furthermore, the different types of regions may include regions defined based on at least a subset of functionality in the integrated circuit. Regions may also correspond to the locations which are far from the edges of the target pattern, either inside or outside of the polygons in the target pattern. Furthermore, the different regions may be defined based on at least a subset of functionality in the integrated circuit, or based on user-defined criteria.

When determining the mask pattern and/or the write pattern to be used to print a wafer pattern that is to approximate this target pattern, these regions may be treated differently. For example, in some embodiments, a mask pattern is determined based on an initial mask pattern, or a write pattern is determined based on an initial write pattern. In addition, the mask pattern or the write pattern may be determined based on a target pattern and a model of a photolithography process. During the determining, the different regions may have different weights, different convergence criteria, different mask rules (such as those pertaining to a rectilinear projection operation), or other parameters that vary depending upon the region. In some embodiments, pixilated images are used to represent at least one of the following: the target pattern, the mask pattern, or one or more of the regions. The pixilated images may use grayscale to represent the boundaries of the regions with sub-pixel resolution.

We now describe embodiments of a computer system, a method, software, and data structures for determining mask patterns and/or write patterns.

In solving optimization problems of the type described above, or in other problems related to photo-masks, or CAD problems regarding the design of electronic circuits, such as those that arise in the Electronic Design Automation industry (EDA), it may be desirable to treat different portions of a pattern differently. For example, in OPC, it may be desirable to optimize line ends differently from gates. This is illustrated in FIG. 1, which provides a block diagram illustrating a feature 110 in a pattern (such as a target pattern) and associated regions 112, 114, 116, 118, and 120 in accordance with an embodiment 100 of the present invention. These regions are defined around edges in the feature that are to be printed on a wafer. In particular, the different regions correspond to different types of regions in the feature 110. For example, the different types of regions may include corners (regions 112), rectangular end portions (regions 114), straight portions (regions 118), angular portions (regions 120), and/or transitional regions (regions 116) between any two respective regions.

Note that the different regions may have different sizes. For example, regions 112 associated with corners in the feature 110 are larger than regions 118 associated with straight portions in the feature 110. Note that at least some of the regions 112, 114, 116, 118, and/or 120 may overlap, such as region 116-2 and region 118-1. As discussed further below, the regions 112, 114, 116, 118, and 120 may define areas in the target pattern that may be treated differently when determining a mask pattern and/or a write pattern that is associated with the target pattern. For example, in some embodiments such mask patterns or write patterns are determined using an iterative calculation that uses different convergence criteria for one or more of the different regions.

Alternatively, the iterative calculation may be based on a difference between the target pattern and an estimated pattern that is to be printed on a wafer using a lithographic process which includes a photo-mask associated with the mask pattern and/or which drives a write device based on the write pattern. When determining this difference, different weights may be used for the different regions. For example, a first type of region including one or more corners in the target pattern may have a lower weight than a second type of region that includes one or more straight portions in the target pattern.

And in some embodiments, the mask pattern or the write pattern that is determined in such a calculation is subject to a rectilinear-projection operation having a minimum segment length and that conserves an area of features in the mask pattern or the write pattern. This operation may be performed in order to improve the manufacturability (i.e., in order to lower the cost) of the associated photo-mask. During this operation, the different mask rules (such as different tolerances associated with the rectilinear projection) may be applied for one or more of the different regions. In this way, features in the mask pattern or the write pattern that correspond to corners in the target pattern may be subject to a more aggressive rectilinear-projection operation than features in the mask pattern or the write pattern that correspond to straight portions in the target pattern.

Note that these iterative calculations may include an optical proximity correction. As discussed further below, in some embodiments the determining includes calculating a gradient of a function, such as a merit of error function (which is proportional to the difference between the target pattern and the estimated pattern). Note that the gradient may be calculated based on a formula obtained by taking a derivative of the function.

In an example embodiment, the mask pattern or write pattern is determined using an inverse calculation, in which a desired or acceptable wafer pattern is used to determine a photo-mask or an input pattern to a maskless lithography tool.

Furthermore, in some embodiments the estimated wafer pattern is determined using a model of the photo-lithographic process. For embodiments of a lithographic process, this model may include a photo-resist model or an etch model. In an example embodiment, the estimated pattern is determined using a model of a photolithography process.

The regions 112, 114, 116, 118, and/or 120 may be defined based on user criteria and/or with topology of one or more of the regions 112, 114, 116, 118, and/or 120 in the feature 110. Furthermore, at least one of the regions 112, 114, 116, 118, and/or 120 may include one or more gates or line ends in an integrated circuit, and/or may correspond to at least a subset of functionality in the integrated circuit. This approach to classifying the different types of regions may be useful in determining an impact of particular regions on manufacturing yield and/or proper circuit function (for example, a transistor gate may be particularly important and therefore regions corresponding to a gate may be treated accordingly).

In some embodiments, the regions 112, 114, 116, 118, and/or 120, the target pattern, one or more mask patterns, and/or an estimated wafer pattern may be represented by bitmap images and/or grayscale images. In some embodiments the grayscale image is a distance function in which the value of the various pixels indicates a distance to the edge or contour of the feature 110. Such representations may include binary pixels, or may involve continuous tone or gray scale pixels. These may represent either a continuous tone pattern, or may implicitly represent a binary pattern (such as a chrome on glass photo-mask). Note that the patterns initially in a polygon-type format (such as GDSII) may be converted into a pixel-based format, an image-based format, or area-based format prior determining the mask pattern and/or write pattern. Therefore, in some embodiments one or more patterns and/or images used in the determining and/or calculations may be compatible with formats including GDSII or Oasis. Also note that for those embodiments with grayscale images, the determining of the mask pattern and/or the write pattern, as well as determination of differences between the target pattern and the estimated pattern may be performed at sub-pixel resolution.

In addition, to determining suitable mask patterns and/or write patterns, calculations may be performed to determine or verify that the mask patterns and/or write patterns result in a large enough process window. As a consequence, the determining may be performed over a range of process conditions in the photo-lithographic process.

The lithographic process used to print a wafer pattern that is to approximate a target pattern that includes regions 112, 114, 116, 118, and/or 120 may include a wide variety of process and/or optical conditions. For example, off-axis illumination, dipole illumination, quadropole illumination, quasar illumination, incoherent illumination, coherent illumination, and/or any arbitrary illumination aperture may be used. In addition, one or more light sources may include I line, g line, a wavelength of 193 nm, a wavelength of 248 nm, immersion, and/or any other optical lithography wavelength in air, water, or other fluid or gas. Furthermore, the mask patterns may correspond to photo-masks that include polarizing regions, chrome regions, phase-shifting regions, or attenuated phase shifting regions.

The semiconductor-manufacturing process may use a laser-writer or direct-write device. In these embodiments, the mask pattern (corresponding to the photo-mask) described above is not physically manifested. Instead, there is a write pattern that is to guide the writing of the direct-write device in order to print the target pattern on a wafer. Note that the lithographic process and/or the semiconductor-manufacturing process may include multiple exposures.

Note that in some embodiments the feature 110 in the pattern may include fewer or additional components, two or more components may be combined into a single component, and/or a position of one or more components (such as one of the regions 112, 114, 116, 118, and/or 120) may be changed.

Figure 2:
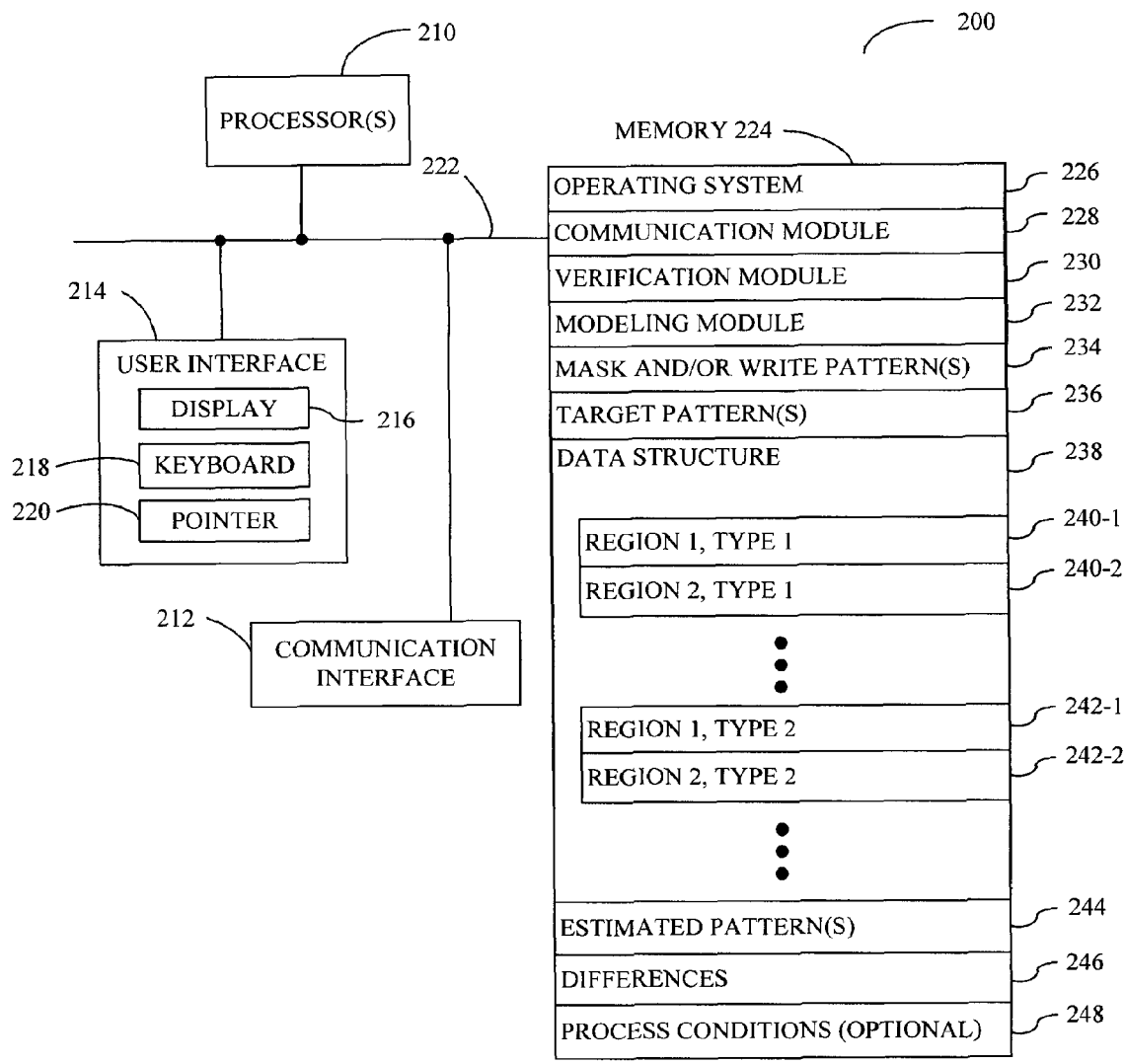
FIG. 2 is a block diagram illustrating a computer system in accordance with an embodiment of the present invention.

FIG. 2 provides a block diagram illustrating a computer system 200 in accordance with an embodiment of the present invention. The computer system 200 includes one or more processors 210, a communication interface 212, a user interface 214, and one or more signal lines 222 coupling these components together. Note that the one or more processing units 210 may support parallel processing and/or multithreaded operation, the communication interface 212 may have a persistent communication connection, and the one or more signal lines 222 may constitute a communication bus. Moreover, the user interface 214 may include a display 216, a keyboard 218, and/or a pointer 220, such as a mouse.

Memory 224 in the computer system 200 may include volatile memory and/or non-volatile memory. More specifically, memory 224 may include ROM, RAM, EPROM, EEPROM, FLASH, one or more smart cards, one or more magnetic disc storage devices, and/or one or more optical storage devices. Memory 224 may store an operating system 226 that includes procedures (or a set of instructions) for handling various basic system services for performing hardware dependent tasks. The memory 224 may also store communications procedures (or a set of instructions) in a communication module 228. The communication procedures may be used for communicating with one or more computers, devices and/or servers, including computers, devices and/or servers that are remotely located with respect to the computer system 200.

Memory 224 may also include one or more program modules (or a set of instructions), including a verification module 230 (or a set of instructions) for verifying a lithographic process and/or a semiconductor-manufacturing process. In addition, memory 224 may include a modeling module 232 (or a set of instructions) for calculating estimated wafer patterns, mask patterns, and/or write patterns. For example, the modeling module 232 may include a forward-optical model of an optical path and/or may perform an inverse lithographic calculation. Note that such optical models may include Fourier representations of the optical path.

Furthermore, memory 224 may include one or more mask and/or write patterns 234, one or more target patterns 236, one or more estimated patterns 244, one or more differences 246 between one or more estimated patterns and one or more target patterns, and/or optional process conditions (which may be used to study a process window). In addition, memory 224 may include a data structure 238 that includes information for different types of regions 240 and 242.

Instructions in the various modules in the memory 224 may be implemented in a high-level procedural language, an object-oriented programming language, and/or in an assembly or machine language. The programming language may be compiled or interpreted, i.e, configurable or configured to be executed by the one or more processing units 210.

Although the computer system 200 is illustrated as having a number of discrete components, FIG. 2 is intended to be a functional description of the various features that may be present in the computer system 200 rather than as a structural schematic of the embodiments described herein. In practice, and as recognized by those of ordinary skill in the art, the functions of the computer system 200 may be distributed over a large number of servers or computers, with various groups of the servers or computers performing particular subsets of the functions. In some embodiments, some or all of the functionality of the computer system 200 may be implemented in one or more ASICs, FPGAs, graphics processors, and/or one or more digital signal processors DSPs.

Computer system 200 may include fewer components or additional components, two or more components may be combined into a single component, and/or a position of one or more components may be changed. In some embodiments the functionality of computer system 200 may be implemented more in hardware and less in software, or less in hardware and more in software, as is known in the art.

In an example embodiment, an inverse calculation is used in the determining of one or more mask patterns and/or one or more write patterns. The inverse calculation may be based on minimization of an error function (which is also sometimes referred to as a cost function or merit function or a Hamiltonian function). During each iteration of the calculation, the error function may be a function of the difference between an estimated pattern that results when an image of a photo-mask (corresponding to a mask pattern) or an image associated with a write pattern is projected through a lithographic device or a write device. In an exemplarily embodiment the mask pattern may be represented by a level-set function, and the mask pattern is optimized by employing a gradient descent type algorithm, where the gradient is a Frechet derivative of the merit function. This is just one example of many alternative methods for finding an optimized mask pattern that are known to one skilled in the art. For example, some embodiments may use the methods described in U.S. patent application Ser. Nos. 10/408,924; 10/408,928 (issuing as U.S. Pat. No. 7,124,394); and Ser. No. 11/531,673, each of which is incorporated herein by reference in its entirety. Model based optical proximity correction, or OPC, is another possible method that can be used in some embodiments.

We now discuss methods for determining mask patterns and/or write patterns. FIG. 3 provides a flow chart illustrating a process 300 for determining a mask pattern in accordance with an embodiment of the present invention. During this process, a set of regions corresponding to different locations on a target pattern is determined (310). Then, a mask pattern is determined in accordance with the target pattern and a model of a photolithographic process, wherein the determining includes different treatment for the different regions (312). The mask pattern, the target pattern and/or one or more of the regions may include pixilated images.

Figure 4:
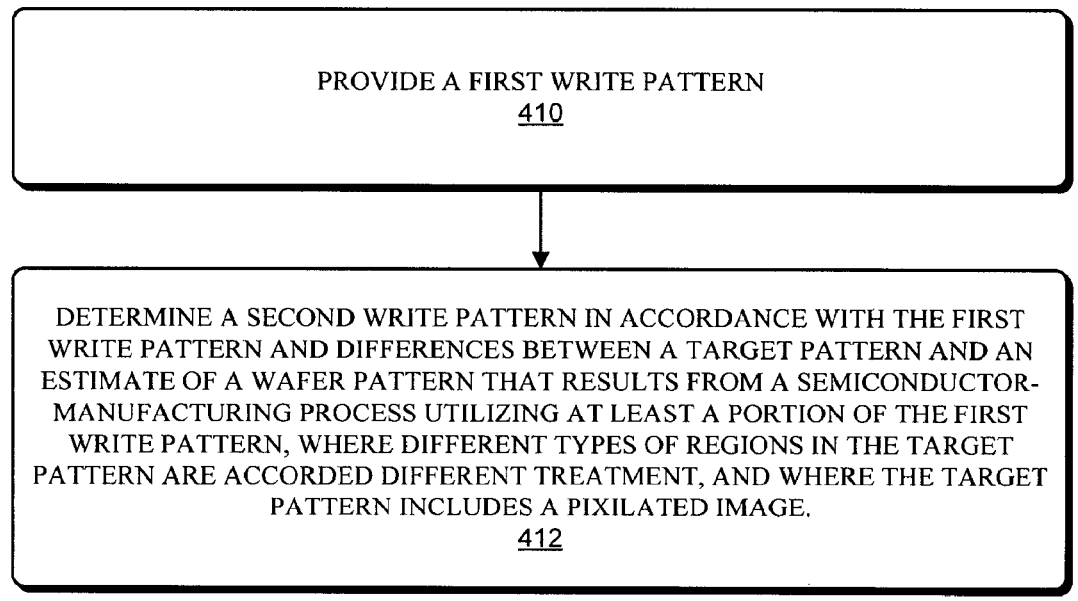
FIG. 4 is a flow chart illustrating a process for determining a write pattern in accordance with an embodiment of the present invention.

FIG. 4 provides a flow chart illustrating a process 400 for determining a write pattern in accordance with an embodiment of the present invention. During this process, a set of regions corresponding to different locations on a target pattern is determined (410). Then, a write pattern is determined in accordance with the target pattern and a model of a photolithographic process, wherein the determining includes different treatment for the different regions (412). Note that the different types of regions in the target pattern are accorded different treatment. The target pattern and/or one or more of the regions may include pixilated images.

Note that in some embodiments of the process 300 and/or the process 400 there may be additional or fewer operations, the order of the operations may be changed, and two or more operations may be combined into a single operation.

Figure 5:
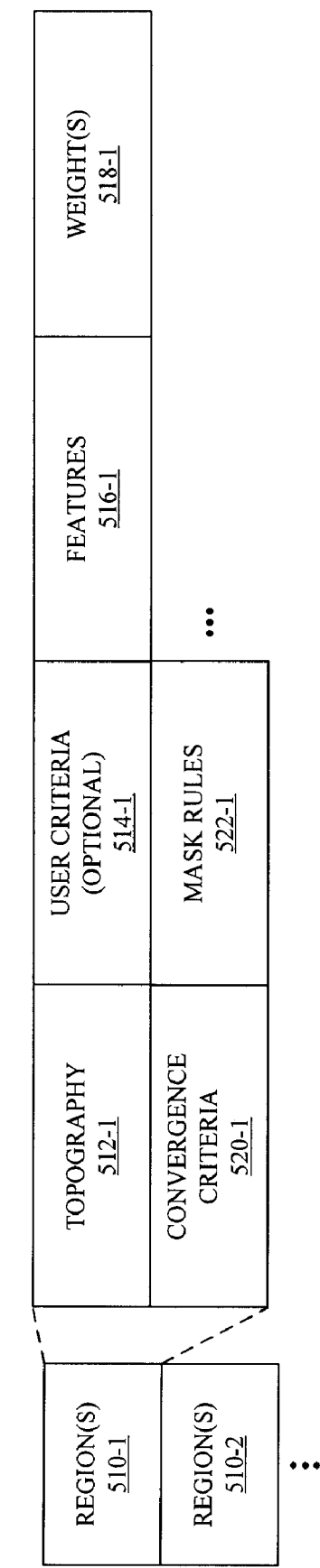
FIG. 5 is a block diagram illustrating a data structure in accordance with an embodiment of the present invention.

We now discuss data structures that may be used in the computer system 200 (FIG. 2). FIG. 5 provides a block diagram illustrating a data structure 600 in accordance with an embodiment of the present invention. This data structure may include regions 510. For example, regions 510-1 may include one or more topography types 512-1, optional user criteria 514-1, one or more associated features 516-1, one or more weights 518-1, one or more convergence criteria 520-1, and/or one or more mask rules 522-1. Note that that in some embodiments of the data structure 500 there may be fewer or additional components, two or more components may be combined into a single component, and/or a position of one or more components may be changed.

What is claimed is:
1. A computer-implemented method for determining a mask pattern to be used on a photo-mask in a photolithographic process, comprising:
    determining, by a computer, a set of regions corresponding to different locations on a target pattern;

representing a first mask pattern with a pixel based representation;

determining a second mask pattern in accordance with the first mask pattern, the target pattern and a model of a photolithographic process, wherein the determining includes different treatment for different regions in the set of regions, wherein the determining involves an inverse optical calculation in which the second mask pattern in the model of the photolithographic process is calculated based on the model of the photolithographic process and information in an image at an output of the model of the photolithographic process, wherein determining the second mask pattern involves a rectilinear-projection operation having a minimum segment length, and wherein the rectilinear-projection operation conserves an area of features in the second mask pattern.

2. A computer-implemented method for determining a mask pattern to be used on a photo-mask in a photolithographic process, comprising:

determining, via the computer, a set of regions corresponding to different locations on a target pattern;

representing a first mask pattern with a pixel based representation;

determining a second mask pattern in accordance with the first mask pattern, the target pattern and a model of a photolithographic process, wherein the determining is dependent upon at least one parameter, wherein the value of the parameter is different for the different regions in the set of regions, wherein the determining involves an inverse optical calculation in which the second mask pattern in the model of the photolithographic process is calculated based on the model of the photolithographic process and information in an image at an output of the model of the photolithographic process, wherein determining the second mask pattern involves a rectilinear-projection operation having a minimum segment length, and wherein the rectilinear-projection operation conserves an area of features in the second mask pattern.

3. The method of claim 2, wherein the parameter includes weights of the different types of regions when calculating a merit function.

4. The method of claim 2, wherein at least some of the regions are associated with different geometries of the target pattern, and wherein the different geometries include at least one of line ends, inner corners, outer corners, and straight regions.

5. The method of claim 2, wherein at least some of the regions are associated with transistor gates.

6. The method of claim 3, wherein a first type of region including one or more corners in the target pattern has a lower weight than a second type of region including one or more straight portions in the target pattern.

7. The method of claim 3, wherein at least some of the weights are defined in accordance with user criteria.

8. The method of claim 3, wherein at least some of the weights are defined in accordance with topology of one or more types of regions in the target pattern.

9. The method of claim 3, wherein the weights are associated with features in the target pattern.

10. The method of claim 2, wherein the at least one parameter includes different convergence criteria for the different types of regions.

11. The method of claim 2, wherein the at least one parameter includes different mask rules for the different types of regions.

12. The method of claim 2, wherein the model of the photo-lithographic process includes a photo-resist model or an etch model.

13. The method of claim 2, wherein the pixel based representation uses gray-scale values to provide for sub-pixel resolution.

14. The method of claim 13, wherein the determining is performed at sub-pixel resolution.

15. The method of claim 2, wherein the determining is performed over a range of process conditions in the photolithographic process.

16. The method of claim 2, wherein at least some of the different types of regions at least partially overlap.

17. The method of claim 2, wherein at least one type of region in the different types of regions includes one or more gates in an integrated circuit.

18. The method of claim 2, wherein the different types of regions include regions defined based on at least a subset of functionality in an integrated circuit.

19. The method of claim 2, wherein the determining is performed in accordance with an optical proximity correction algorithm.

20. The method of claim 2, wherein the determining includes calculating a gradient of a merit function, wherein the gradient is calculated in accordance with a formula obtained by taking a derivative of the merit function, and wherein the merit function corresponds to a difference of the information in the image at the output of the model of the photolithographic process and the target pattern.

21. A non-transitory computer-program product for use in conjunction with a computer system, the computer-program product comprising a computer-readable storage medium and a computer-program mechanism embedded therein for determining a mask pattern to be used on a photo-mask in a photolithographic process, the computer-program mechanism including:

instructions for determining a set of regions corresponding to different locations on a target pattern;

instructions for representing a first mask pattern with a pixel based representation;

instructions for determining a second mask pattern in accordance with the first mask pattern, the target pattern and a model of a photolithographic process, wherein the determining is dependent upon at least one parameter, wherein the value of the parameter is different for the different regions in the set of regions, wherein the determining involves an inverse optical calculation in which the second mask pattern in the model of the photolithographic process is calculated based on the model of the photolithographic process and information in an image at an output of the model of the photolithographic process, wherein determining the second mask pattern involves a rectilinear-projection operation having a minimum segment length, and wherein the rectilinear-projection operation conserves an area of features in the second mask pattern.

22. A computer system, comprising:

at least one processor;

at least one memory; and at least one program module, the program module stored in the memory and configured to be executed by the processor, wherein at least the program module is for determining a mask pattern to be used on a photo-mask in a photolithographic process, the program module including:

instructions for determining a set of regions corresponding to different locations on a target pattern;

instructions for representing a first mask pattern with a pixel based representation;

instructions for determining a second mask pattern in accordance with the first mask pattern, the target pattern and a model of a photolithographic process, wherein the determining is dependent upon at least one parameter, wherein the value of the parameter is different for the different regions in the set of regions, wherein the determining involves an inverse optical calculation in which the second mask pattern in the model of the photolithographic process is calculated based on the model of the photolithographic process and information in an image at an output of the model of the photolithographic process, wherein determining the second mask pattern involves a rectilinear-projection operation having a minimum segment length, and wherein the rectilinear-projection operation conserves an area of features in the second mask pattern.

23. A photo-mask for use in a photolithographic process, wherein a mask pattern to which the photo-mask corresponds is determined in a process including the operations of:

determining, by a computer, a set of regions corresponding to different locations on a target pattern;

representing a first mask pattern with a pixel based representation;

determining a second mask pattern in accordance with the first mask pattern, the target pattern and a model of a photolithographic process, wherein the determining is dependent upon at least one parameter, wherein the value of the parameter is different for the different regions in the set of regions, wherein the determining involves an inverse optical calculation in which the second mask pattern in the model of the photolithographic process is calculated based on the model of the photolithographic process and information in an image at an output of the model of the photolithographic process, wherein determining the second mask pattern involves a rectilinear-projection operation having a minimum segment length, and wherein the rectilinear-projection operation conserves an area of features in the second mask pattern.

24. A semiconductor wafer, wherein the semiconductor wafer is produced in a photo-lithographic process that includes a photo-mask, wherein a mask pattern to which the photo-mask corresponds is determined in a process including the operations of:

determining, by a computer, a set of regions corresponding to different locations on a target pattern;

representing a first mask pattern with a pixel based representation;

determining a second mask pattern in accordance with the first mask pattern, the target pattern and a model of a photolithographic process, wherein the determining is dependent upon at least one parameter, wherein the value of the parameter is different for the different regions in the set of regions, wherein the determining involves an inverse optical calculation in which the second mask pattern in the model of the photolithographic process is calculated based on the model of the photolithographic process and information in an image at an output of the model of the photolithographic process, wherein determining the second mask pattern involves a rectilinear-projection operation having a minimum segment length, and wherein the rectilinear-projection operation conserves an area of features in the second mask pattern.

25. A data file stored in a computer-readable memory, comprising information corresponding to a mask pattern, wherein the mask pattern corresponds to a photo-mask that is to print a wafer pattern in a semiconductor-manufacturing process, wherein the mask pattern is determined in a process that includes the operations of:

determining, by a computer, a set of regions corresponding to different locations on a target pattern;

representing a first pattern with a pixel based representation;

determining a second pattern in accordance with the first pattern, the target pattern and a model of a photolithographic process, wherein the determining is dependent upon at least one parameter, wherein the value of the parameter is different for the different regions in the set of regions, wherein the determining involves an inverse optical calculation in which the second mask pattern in the model of the photolithographic process is calculated based on the model of the photolithographic process and information in an image at an output of the model of the photolithographic process, wherein determining the second mask pattern involves a rectilinear-projection operation having a minimum segment length, and wherein the rectilinear-projection operation conserves an area of features in the second mask pattern.

* * * * *